US008519601B2

(12) United States Patent
Shimao et al.

(10) Patent No.: US 8,519,601 B2
(45) Date of Patent: Aug. 27, 2013

(54) CRYSTAL DEVICE AND INSPECTION METHOD OF CRYSTAL DEVICE

(75) Inventors: Kenji Shimao, Saitama (JP); Manabu Ishikawa, Saitama (JP); Hiroyuki Sasaki, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 2 days.

(21) Appl. No.: 13/426,613

(22) Filed: Mar. 22, 2012

(65) Prior Publication Data
US 2012/0242195 A1   Sep. 27, 2012

(30) Foreign Application Priority Data

Mar. 23, 2011 (JP) ................................. 2011-063861

(51) Int. Cl.
*H01L 41/08* (2006.01)
(52) U.S. Cl.
USPC ......................................... 310/344; 310/348
(58) Field of Classification Search
USPC ................................................. 310/344, 348
See application file for complete search history.

(56) References Cited

U.S. PATENT DOCUMENTS

| | | | | |
|---|---|---|---|---|
| 7,427,822 B2* | 9/2008 | Kusai | ............. | 310/344 |
| 7,642,699 B2* | 1/2010 | Kojo | ............. | 310/344 |
| 7,990,026 B2* | 8/2011 | Otake | ............. | 310/344 |
| 8,093,785 B2* | 1/2012 | Wada | ............. | 310/340 |

FOREIGN PATENT DOCUMENTS
JP       2010-161528        7/2010

* cited by examiner

*Primary Examiner* — Mark Budd
(74) *Attorney, Agent, or Firm* — Jianq Chyun IP Office

(57) ABSTRACT

A crystal device and an inspection method for inspecting the crystal device are provided. The crystal device includes: a crystal plate; excitation electrodes formed on the crystal plate; extraction electrodes extending from the excitation electrodes; electrode pads electrically connected with the extraction electrodes; a package including mounting terminals formed on a mounting surface and connection terminals formed on a bottom surface, which is on the other side of the mounting surface, and electrically connected with the mounting terminals; and an electrically-conductive adhesive agent bonding and fixing the connection terminals to the electrode pads. An bonding status inspection region, on which no metal film is formed, is formed in the crystal plate, and the bonding status inspection region is surrounded by or adjacent to the electrode pads. In addition, the bonding status inspection region occupies not more than 25% of the area of the electrode pads.

8 Claims, 14 Drawing Sheets

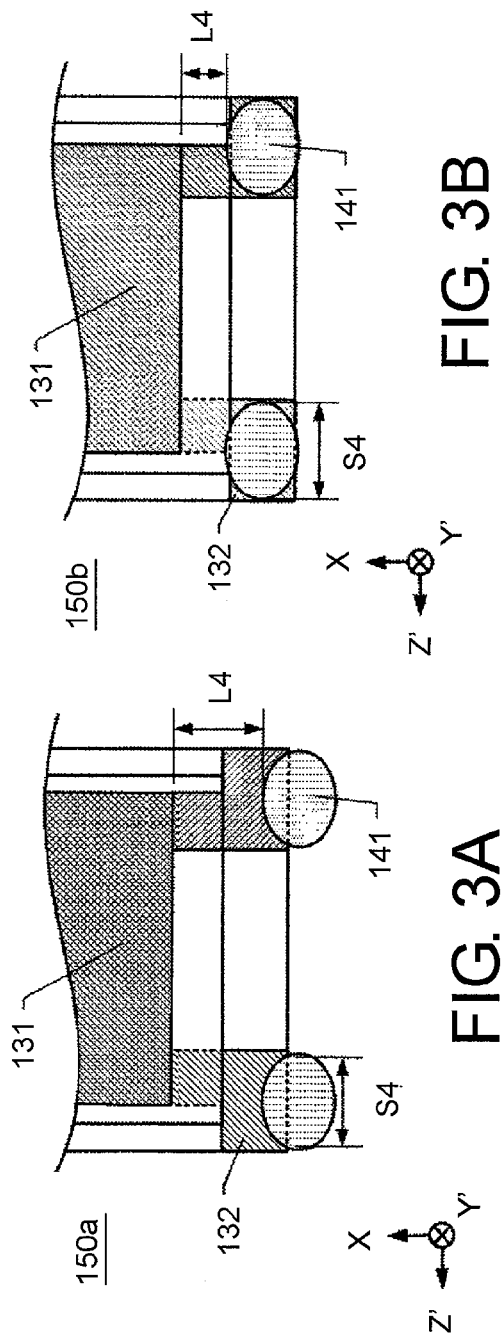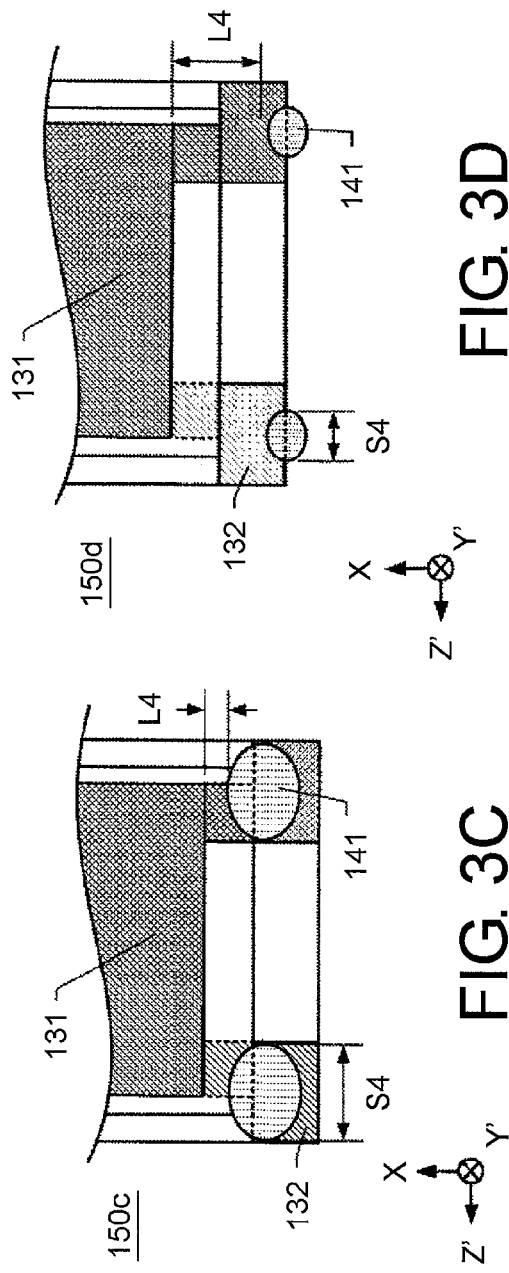

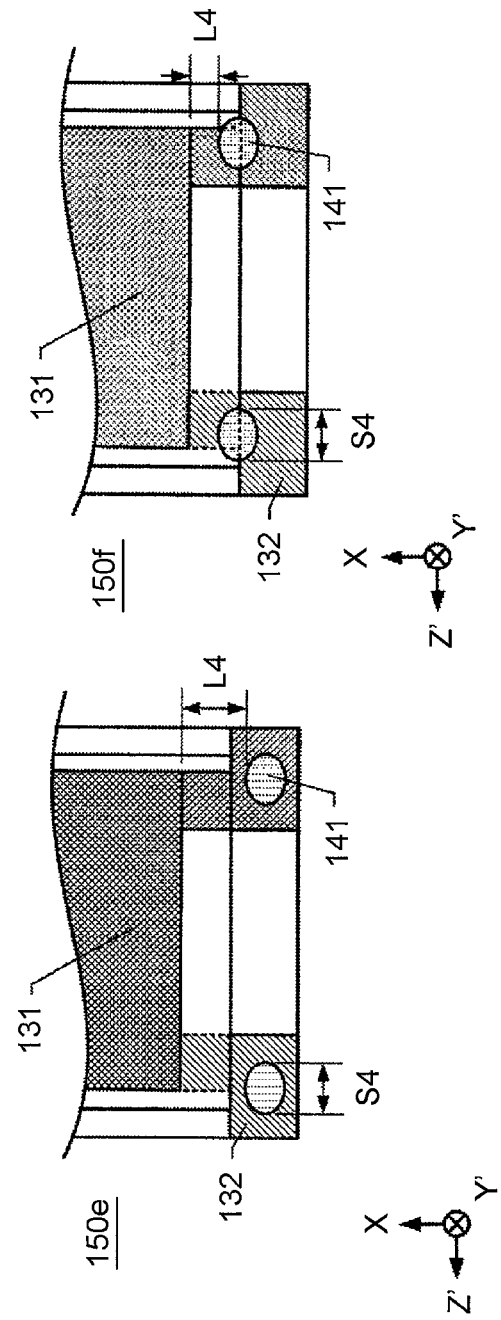

CRYSTAL DEVICE AND INSPECTION METHOD OF CRYSTAL DEVICE

CROSS-REFERENCE TO RELATED APPLICATIONS

This application claims the priority benefit of Japan application serial no. 2011-063861, filed on Mar. 23, 2011. The entirety of the above-mentioned patent application is hereby incorporated by reference herein and made a part of this specification.

BACKGROUND OF THE INVENTION

1. Field of the Invention

The invention relates to a crystal device, wherein a bonding status of an electrically-conductive adhesive agent can be inspected, and an inspection method of the crystal device.

2. Description of the Related Art

It is known that a crystal device is formed by forming excitation electrodes and electrode pads on a crystal plate, and electrically connecting the electrode pads with a package via an electrically-conductive adhesive agent. In such a crystal device, the bonding status of the electrically-conductive adhesive agent and the electrode pads affects the characteristics of the crystal device. For example, if a bonding area of the electrically-conductive adhesive agent and the electrode pads is small, a bonding strength between the crystal plate and the electrically-conductive adhesive agent decreases, and an impact resistance of the crystal device is reduced as well. For this reason, it is desirable to check the bonding status of the crystal plate and the electrically-conductive adhesive agent.

The published application JP 2010-161528, for example, discloses a piezoelectric substrate including a mount electrode section for checking the bonding status of the electrically-conductive adhesive agent. The published application JP 2010-161528 discloses that the piezoelectric substrate includes an exposure section, which is formed in the mount electrode section to expose the piezoelectric substrate, and the electrically-conductive adhesive agent that is spread and bonds to the piezoelectric substrate, and can be inspected through the exposure section.

SUMMARY OF THE INVENTION

Problem to be Solved by the Invention

However, according to the published application JP 2010-161528, a large exposure section is formed. As a result, the bonding area of the mount electrode and the electrically-conductive adhesive agent is reduced, which raises the concern that an electrical resistance between the mount electrode and the electrically-conductive adhesive agent and a CI (crystal impedance) value may both increase.

Accordingly, the invention provides a crystal device, wherein a bonding status of an electrically-conductive adhesive agent and a piezoelectric substrate can be checked, while an electrical resistance between electrode pads and the electrically-conductive adhesive agent maintains small, and an inspection method for inspecting the crystal device.

Solution to the Problem

According to the first aspect of the invention, a crystal device includes: a crystal plate that has a rectangular shape and includes a pair of long sides and a pair of short sides; a pair of excitation electrodes respectively configured on a front side and a back side of the crystal plate; a pair of extraction electrodes extending from the pair of excitation electrodes; a pair of electrode pads configured along at least one of the pair of short sides of the crystal plate and electrically connected with the pair of extraction electrodes; a package having a mounting surface and a bottom surface opposite to the mounting surface and includes a pair of mounting terminals configured on the mounting surface and a pair of connection terminals configured on the bottom surface and electrically connected with the mounting terminals; and an electrically-conductive adhesive agent that bonds and fixes the pair of connection terminals and the pair of electrode pads. A bonding status inspection region, on which no metal film is formed, is configured in the crystal plate, and the bonding status inspection region is surrounded by or connected to the pair of electrode pads. In addition, the bonding status inspection region occupies not more than 25% of the area of the pair of electrode pads.

According to the second aspect of the invention, a crystal device includes: a crystal plate that has a rectangular shape and includes a pair of long sides and a pair of short sides; a pair of excitation electrodes respectively configured on a front side and a back side of the crystal plate; a pair of extraction electrodes extending from the pair of excitation electrodes; a pair of electrode pads configured along the short sides of the crystal plate and electrically connected with the pair of extraction electrodes; a package having a mounting surface and a bottom surface opposite to the mounting surface and includes a pair of mounting terminals configured on the mounting surface and a pair of connection terminals configured on the bottom surface and electrically connected with the mounting terminals; and an electrically-conductive adhesive agent that bonds and fixes the pair of connection terminals and the pair of electrode pads. A bonding status inspection region, on which no metal film is formed, is configured in the crystal plate, and the bonding status inspection region is surrounded by or connected to the pair of electrode pads. In addition, the bonding status inspection region is configured at least in a range, which is 10%~15% of a length of the crystal plate in a longitudinal direction, from an end portion of the pair of excitation electrode at a side of the electrode pads.

According to the third aspect of the invention, which is based on the crystal device of the first aspect, the bonding status inspection region is formed at least in a range, which is 10%~15% of a length of the crystal plate in a longitudinal direction, from an end portion of the pair of excitation electrode at a side of the pair of electrode pads.

According to the fourth aspect of the invention, a plurality of the bonding status inspection regions are configured and arranged in a longitudinal direction.

According to the fifth aspect of the invention, an inspection method is provided for inspecting a crystal device, which includes a crystal plate that has a rectangular shape and includes a pair of long sides and a pair of short sides, a pair of excitation electrodes respectively configured on a front side and a back side of the crystal plate, a pair of extraction electrodes extending from the pair of excitation electrodes, a pair of electrode pads electrically connected with the pair of extraction electrodes, and a package that includes a pair of connection terminals bonded to the electrode pads via an electrically-conductive adhesive agent, wherein a bonding status inspection region, on which no metal film is formed, is configured in the crystal plate to be surrounded by or connected to the pair of electrode pads, and the bonding status inspection region occupies not more than 25% of the area of the pair of electrode pads. The inspection method includes: a checking process for checking a bonding region of the electrically-conductive adhesive agent via the bonding status inspection region, and a determining process for determining whether a range of the bonding region is an appropriate range.

According to the sixth aspect of the invention, the range of the bonding region of the electrically-conductive adhesive agent is determined appropriate when a distance between an end portion of the electrically-conductive adhesive agent at a side of the pair of excitation electrode and an end portion of the pair of excitation electrode at a side of the electrode pads is 10%~15% of a length of the crystal plate in a longitudinal direction.

According to the seventh aspect of the invention, the bonding status inspection region is configured at least in the appropriate range of the bonding region, and the determining process is performed to determine whether the end portion of the electrically-conductive adhesive agent at the side of the pair of excitation electrode is in the appropriate range.

According to the eighth aspect of the invention, the checking process is performed by using an imaging element to image a region including the bonding status inspection region.

According to the crystal device of the invention, the bonding status of the electrically-conductive adhesive agent and the piezoelectric substrate can be checked while the electrical resistance between the pair of electrode pads and the electrically-conductive adhesive agent is maintained small.

BRIEF DESCRIPTION OF THE DRAWINGS

FIG. 3A is a schematic view of bonding condition 150a.

FIG. 3B is a schematic view of bonding condition 150b.

FIG. 3C is a schematic view of bonding condition 150c.

FIG. 3D is a schematic view of bonding condition 150d.

FIG. 3E is a schematic view of bonding condition 150e.

FIG. 3F is a schematic view of bonding condition 150f.

FIG. 5A is a plane view of the electrode pads 132 and the electrically-conductive adhesive agent 141 of the crystal plate 130a.

DESCRIPTION OF THE EMBODIMENTS

Exemplary embodiments of the invention are described in detail below with reference to the drawings. The scope of the invention, however, is not limited by the descriptions of these exemplary embodiments unless otherwise specified.

First Embodiment

<Structure of Crystal Device 100>

Figure 1A:
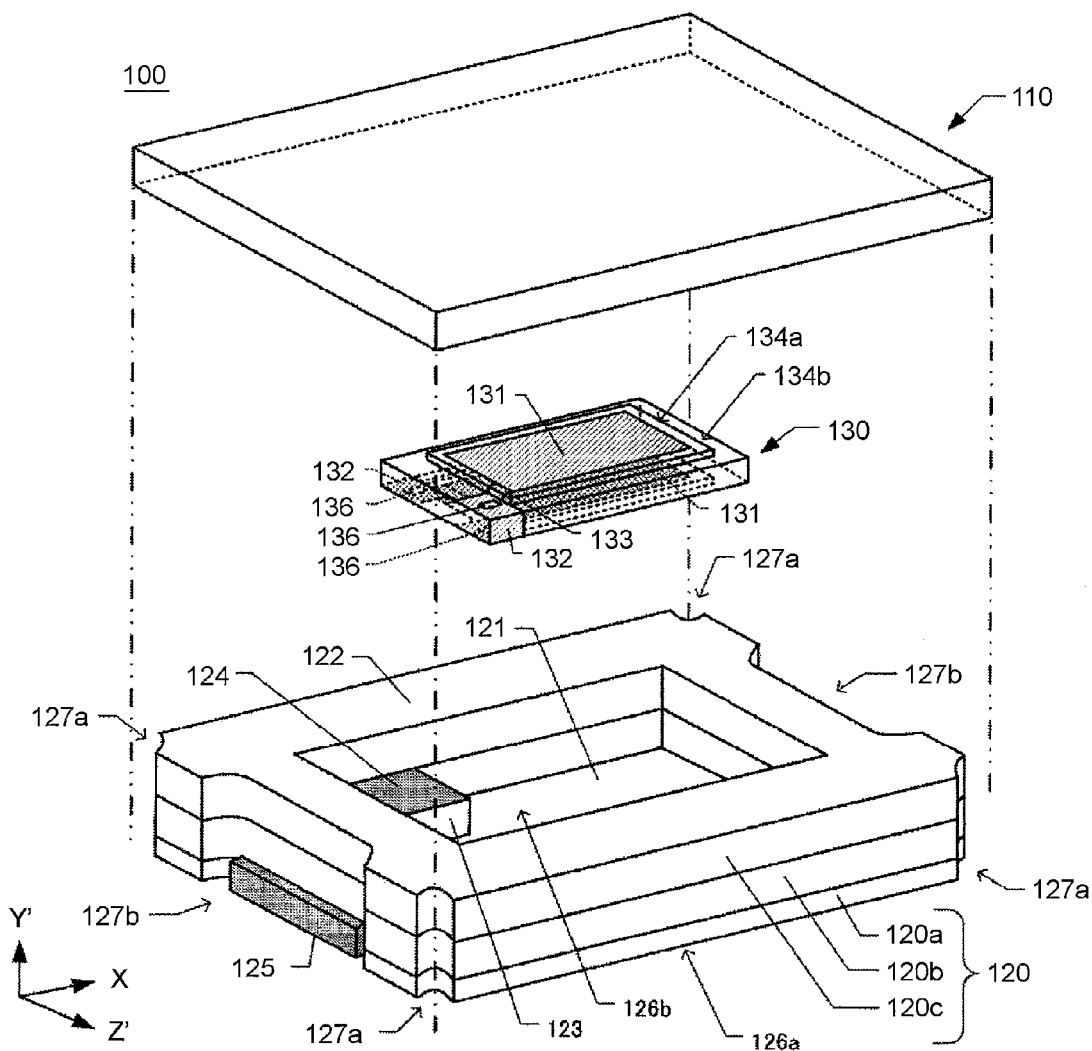
FIG. 1A is an explosive perspective view of a crystal device 100.

FIG. 1A is an explosive perspective view of a crystal device 100. The crystal device 100 includes a crystal plate 130, a lid 110, and a package 120. An AT-cut crystal plate, for example, is used as the crystal plate 130. Relative to a Y axis of a crystal axis (XYZ), a principal surface (YZ plane) of the AT-cut crystal plate is inclined by 35° 15' from a Z axis toward a Y-axis direction with an X axis as the center. In the following descriptions, the axis directions of the AT-cut crystal plate are taken as a reference, and the inclined new axes are respectively defined as a Y' axis and a Z' axis. Namely, in the crystal device 100, a longitudinal direction of the crystal device 100 is described as an X-axis direction, a height direction thereof is described as a Y'-axis direction, and a direction perpendicular to the X-axis direction and the Y'-axis direction is described as a Z'-axis direction.

In the crystal device 100, the crystal plate 130 is disposed in a concave 121 that is formed at the +Y'-axis side of the package 120. Moreover, the lid 110 is bonded to a surface of the package 120 at the +Y'-axis side in a way to seal the concave 121 where the crystal plate 130 is disposed, so as to form the crystal device 100.

The crystal plate 130 is a mesa-type crystal plate, wherein a thickness of an excitation section 134a that oscillates at a predetermined frequency is larger than a thickness of a peripheral section 134b around the excitation section 134a. Excitation electrodes 131 are respectively formed on principal surfaces of the excitation section 134a at the +Y'-axis side and the −Y'-axis side. The excitation electrode 131 formed at the +Y'-axis side is electrically connected with an electrode pad 132 formed at a corner of the crystal plate 130 at the −X-axis side and the +Z'-axis side via an extraction electrode 133. In addition, the excitation electrode 131 formed at the −Y'-axis side is electrically connected with another electrode pad 132 formed at a corner of the crystal plate 130 at the −X-axis side and the −Z'-axis side via another extraction electrode 133. The electrodes, i.e. excitation electrodes 131, electrode pads 132, and extraction electrodes 133, that are formed on the crystal plate 130 are formed with metal films. The metal films are formed by forming a Cr layer on the crystal plate 130 and then forming an Au layer on the Cr layer, for example. Moreover, a bonding status inspection region 136, on which no metal film is formed, is formed surrounding by the electrode pads 132 respectively.

The crystal device 100 is a surface-mount-type crystal device, which is fabricated by fixing and electrically connecting mounting terminals 125 with a printed circuit board, etc., via solder. A surface of the package 120 at the −Y'-axis side is a mounting surface 126a for mounting the crystal device 100, and a pair of mounting terminals 125 (see FIG. 1B) are formed on the mounting surface 126a. In addition, the package 120 is formed into a rectangular shape, wherein castellations 127a are respectively formed at the four corners of the external walls of the package 120, and castellations 127b are respectively formed in the middle of the short sides of the package 120. A portion of the mounting terminals 125 is formed in the castellations 127b respectively. The concave 121 is formed at the +Y'-axis side of the package 120. A bottom surface 126b is formed in the concave 121 and is on the other side of the mounting surface 126a. Carrier sections 123, on which the crystal plate 130 is to be disposed, are formed on the bottom surface 126b, and connection terminals 124 are respectively formed on surfaces of the carrier sections 123 at the +Y'-axis side. The connection terminals 124 and the mounting terminals 125 are electrically connected with each other via connection electrodes 124a respectively (see FIG. 1B). In addition, a bonding surface 122 is formed around the concave 121 of the package 120 for bonding to the lid 110. The package 120 is formed with ceramics, for example, and includes three layers. A first layer 120a is formed into a planar shape and disposed at the −Y'-axis side of the package 120. A surface of the first layer 120a at the −Y'-axis side serves as the mounting surface 126a, on which the mounting terminals 125 are formed. A second layer 120b is disposed at the +Y'-axis side of the first layer 120a. A through hole is formed in a central section of the second layer 120b to form a part of the concave 121. Moreover, in the second layer 120b, the carrier sections 123 are formed in the concave 121, and the connection terminals 124 are respectively formed on the surfaces of the carrier sections 123 at the +Y'-axis side. A third layer 120c is disposed on a surface of the second layer 120b at the +Y'-axis side. A through hole is formed in a central section of the third layer 120c to form a part of the concave 121. In addition, the bonding surface 122 is formed on a surface of the third layer 120c at the +Y'-axis side. The connection terminals 124 and the mounting terminals 125 that are formed in the package 120 are formed by, for example, forming a tungsten layer on ceramics, followed by forming a nickel layer as a base layer on the tungsten layer, and forming a gold layer as a finish plating layer on the nickel layer.

The lid 110 is configured as a planar plate. The lid 110 is bonded to the bonding surface 122 formed on the surface of the package 120 at the +Y'-axis side via a sealant material 142 (see FIG. 1B), so as to seal the concave 121 of the package 120.

Figure 1B:
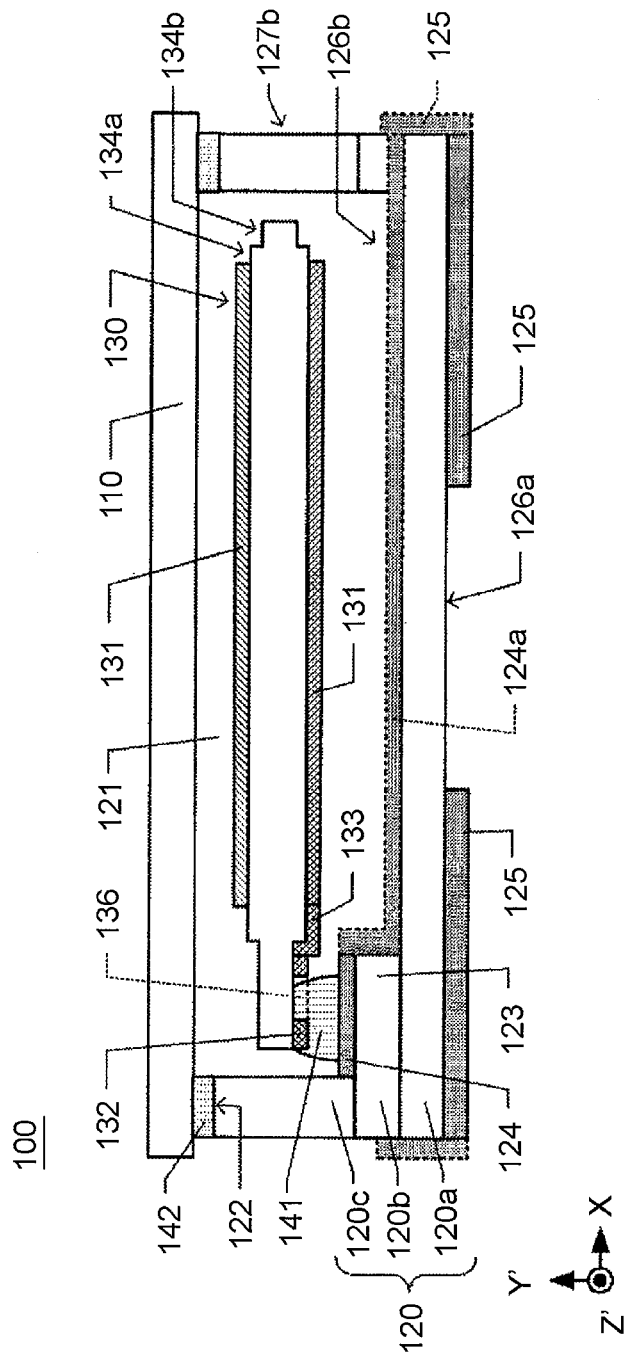
FIG. 1B is a cross-sectional view of the crystal device 100.

FIG. 1B is a cross-sectional view of the crystal device 100. The cross-sectional view of FIG. 1B includes a cross section along the line A-A in FIG. 2B as described below. The carrier sections 123 are formed at the −X-axis side of the concave 121 of the package 120, and the connection terminals 124 are respectively formed on the surfaces of the carrier sections 123 at the +Y'-axis side. The crystal plate 130 is disposed on the carrier sections 123. The electrode pads 132 and the connection terminals 124 are electrically connected with each other via an electrically-conductive adhesive agent 141. The lid 110 is bonded to the bonding surface 122 at the +Y'-axis side of the package 120 via the sealant material 142, so as to seal the concave 121 of the package 120. Moreover, a pair of the mounting terminals 125 are formed on the mounting surface 126a and a portion of the castellations 127b of the package 120. The connection terminals 124 are electrically connected with the mounting terminals 125 formed on the castellations 127b via the connection electrodes 124a formed on the bottom surface 126b of the package 120.

Figure 2A:
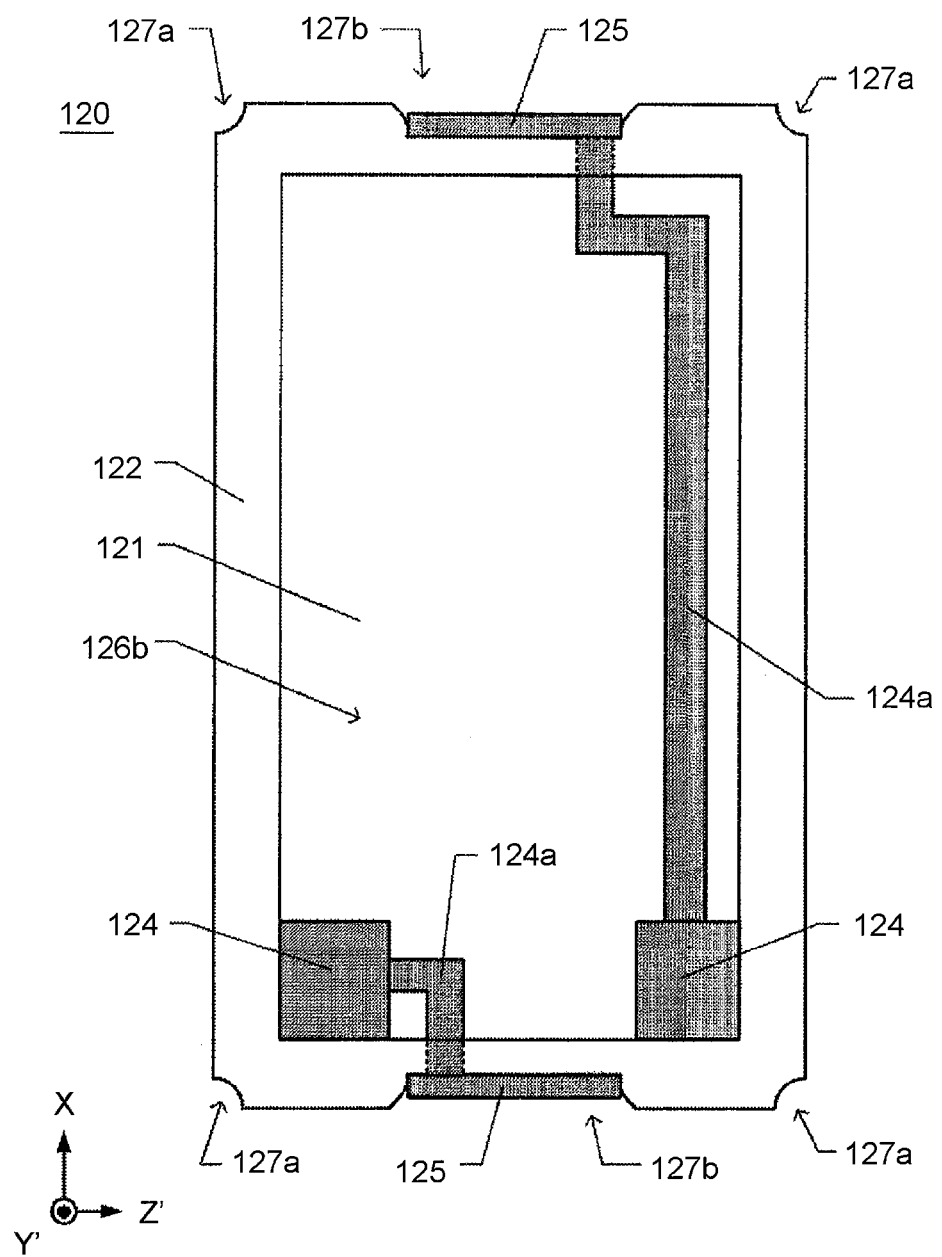
FIG. 2A is a plane view of a package 120.

FIG. 2A is a plane view of the package 120. The concave 121 is formed on the surface of the package 120 at the +Y'-axis side. Moreover, the surface at the −Y'-axis side of the package 120 is the mounting surface 126a (see FIG. 1B), on which the mounting terminals 125 (see FIG. 1B) are formed. The bottom surface 126b, which is on the other side of the mounting surface 126a, is formed in the concave 121. The carrier sections 123 (see FIG. 1B) are respectively formed at the +Z'-axis side and the −Z'-axis side of the −X-axis side of the bottom surface 126b, and the connection terminals 124 are formed on the surfaces of the carrier sections 123 at the +Y'-axis side. The connection terminals 124 formed at the +Z'-axis side and the −Z'-axis side are electrically connected with the mounting terminals 125 at the +X-axis side and the −X-axis side via the connection electrodes 124a formed on the bottom surface 126b respectively. The castellations 127a and 127b that are recessed toward the concave 121 are respectively formed at the four corners of the external wall of the package 120 and in the middle of the external walls of the short sides of the package 120. The package 120 is formed by forming a plurality of packages 120 in a ceramics sheet and then cutting the ceramics sheet into separate packages 120. However, the corners of the packages 120 may be impaired when the ceramics sheet is cut. The castellations 127a are formed in order to prevent the damage of the packages 120 caused by such impairment. Moreover, the castellations 127b are formed, such that a portion of the mounting terminals 125 can be formed on side surfaces of the package 120. The crystal device 100 is mounted to a printed circuit board, etc., via solder, and the solder is also attached to the mounting terminals 125 that are formed on the side surfaces of the crystal device 100. For this reason, a bonding status of the solder can be checked through the solder attached to the mounting terminals 125 formed on the side surfaces of the crystal device 100.

Figure 2B:
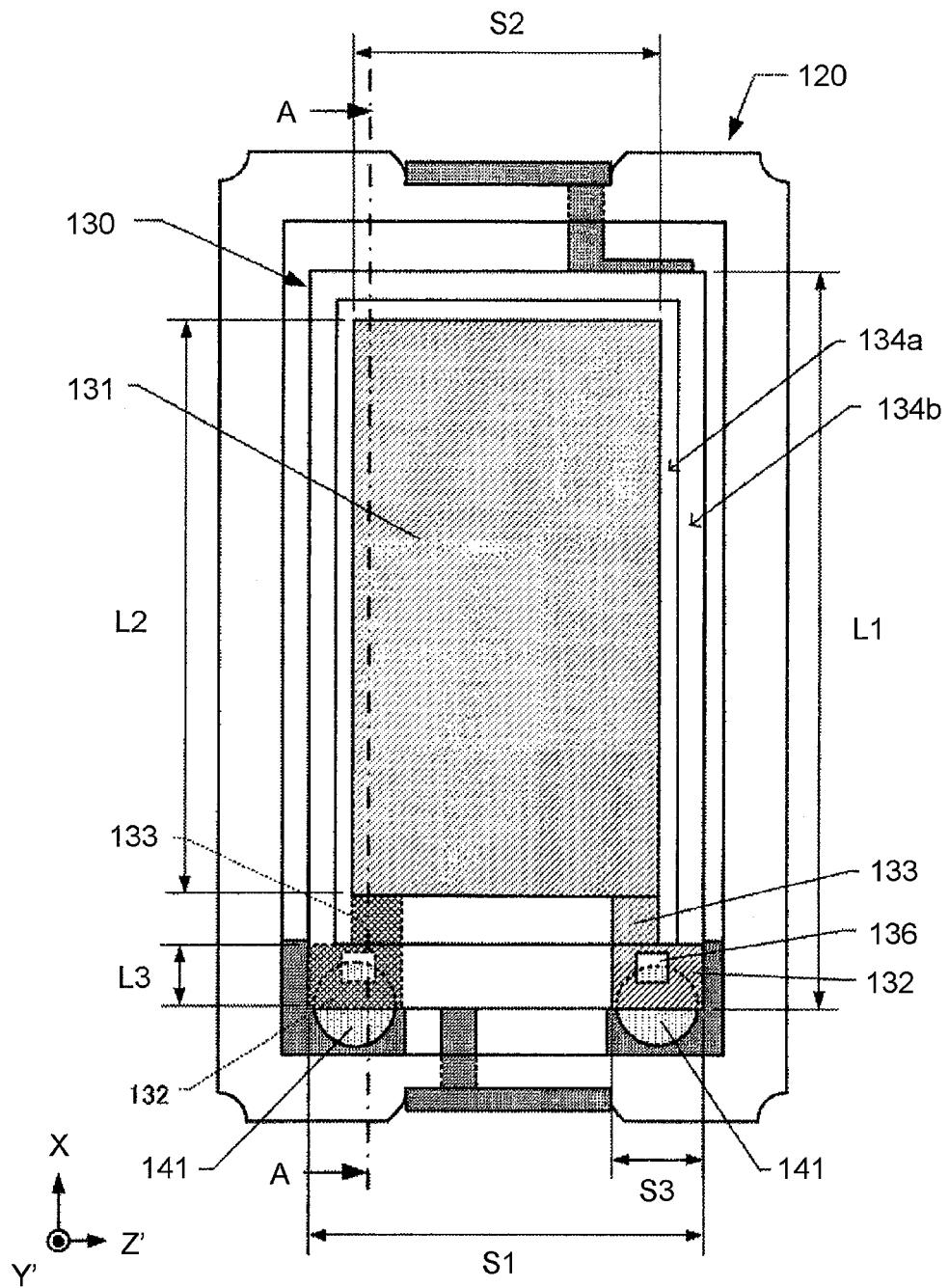
FIG. 2B is a plane view of the package 120, which includes a crystal plate 130 disposed therein.

FIG. 2B is a plane view of the package 120, which includes the crystal plate 130 disposed therein. The crystal plate 130 is electrically connected with the connection terminals 124 of the package 120 through the electrode pads 132 via the electrically-conductive adhesive agent 141. Moreover, a bonding status inspection region 136, on which no electrode is formed, is formed in the peripheral section 134b and respectively surrounded by the electrode pads 132. A bonding status of the electrically-conductive adhesive agent 141 can be observed through the bonding status inspection region 136. The crystal plate 130 is formed into a rectangular shape and has a pair of long sides and a pair of short sides. The long sides are formed in parallel to the X axis, and the short sides are formed in parallel to the Z' axis. A length S1 of the short side of the crystal plate 130 is 0.7 mm and a length L1 of the long side of the crystal plate 130 is 1.0 mm, for example. In addition, a length S2 of a short side of the excitation electrode 131 is 0.5 mm and a length L2 of a long side of the excitation electrode 131 is 0.7 mm. Furthermore, a length S3 of a short side of the electrode pad 132, which is the length of the electrode pad 132 in the Z'-axis direction, is 0.3 mm, and a length L3 of a long side of the electrode pad 132, which is the length of the electrode pad 132 in the X-axis direction, is 0.15 mm.

<Bonding Condition of Crystal Plate 130 and Electrically-Conductive Adhesive Agent 141>

In regard to the bonding of the crystal plate 130 and the electrically-conductive adhesive agent 141, the bonding conditions, such as a bonding position that the electrically-conductive adhesive agent 141 is bonded to the crystal plate 130 and the size of a bonding surface, have a large influence on the CI value of the crystal plate 130. The relationship between the bonding conditions of the crystal plate 130 and the electrically-conductive adhesive agent 141 and the CI value is explained below.

FIG. 3A to FIG. 3F are schematic views depicting the bonding conditions of the electrically-conductive adhesive agent 141 and the crystal plate 130. FIG. 3A to FIG. 3F respectively illustrate the electrode pads 132 of the crystal plate 130 and the electrically-conductive adhesive agent 141 from the aspect of the −Y' axis. The bonding conditions of FIG. 3A to FIG. 3F are respectively referred to as bonding conditions 150a~150f and explained in the following paragraphs.

FIG. 3A is a schematic view of bonding condition 150a. In bonding condition 150a, the electrically-conductive adhesive agent 141 has a large size, and the electrically-conductive adhesive agent 141 is formed close to the −X-axis side of the electrode pad 132. If the shortest distance between an end portion of the electrically-conductive adhesive agent 141 and an end portion of the excitation electrode 131 in the longitudinal direction (the X-axis direction) is defined as a distance L4, and a length of a bonding region of the electrically-conductive adhesive agent 141 and the electrode pad 132 in the transverse direction (the Z'-axis direction) is defined as a length S4, the distance L4 and the length S4 of bonding condition 150a are larger than the distances L4 and the lengths S4 of the below-described bonding conditions 150d~150f.

FIG. 3B is a schematic view of bonding condition 150b. In bonding condition 150b, the electrically-conductive adhesive agent 141 has a large size and is formed near a central section of the electrode pad 132. Accordingly, the distance L4 of bonding condition 150b is shorter than the distance L4 of bonding condition 150a, and the length S4 of bonding condition 150b is the same as the length S4 of bonding condition 150a.

FIG. 3C is a schematic view of bonding condition 150c. In bonding condition 150c, the electrically-conductive adhesive agent 141 has a large size, and the electrically-conductive adhesive agent 141 is formed close to the +X-axis side of the electrode pad 132. Therefore, the distance L4 of bonding condition 150c is shorter than the distances L4 of bonding conditions 150a and 150b, and the length S4 of the bonding condition 150c is the same as the lengths S4 of bonding conditions 150a and 150b.

FIG. 3D is a schematic view of bonding condition 150d. In bonding condition 150d, the electrically-conductive adhesive agent 141 has a small size and is formed close to the −X-axis side of the electrode pad 132. Accordingly, the length S4 of bonding condition 150d is shorter than the lengths S4 of bonding conditions 150a~150c, and the distance L4 of bonding condition 150d is larger than the distances L4 of bonding conditions 150a~150c.

FIG. 3E is a schematic view of bonding condition 150e. In bonding condition 150e, the electrically-conductive adhesive agent 141 has a small size and is formed near the central section of the electrode pad 132. Therefore, the distance L4 of bonding condition 150e is shorter than the distance L4 of bonding condition 150d, and the length S4 of bonding condition 150e is the same as the length S4 of bonding condition 150d.

FIG. 3F is a schematic view of bonding condition 150f. In bonding condition 150f, the electrically-conductive adhesive agent 141 has a small size and is formed close to the +X-axis side of the electrode pad 132. Accordingly, the distance L4 of bonding condition 150f is shorter than the distances L4 of bonding conditions 150d and 150e, and the length S4 of the bonding condition 150f is the same as the lengths S4 of bonding conditions 150d and 150e.

Figure 4A:
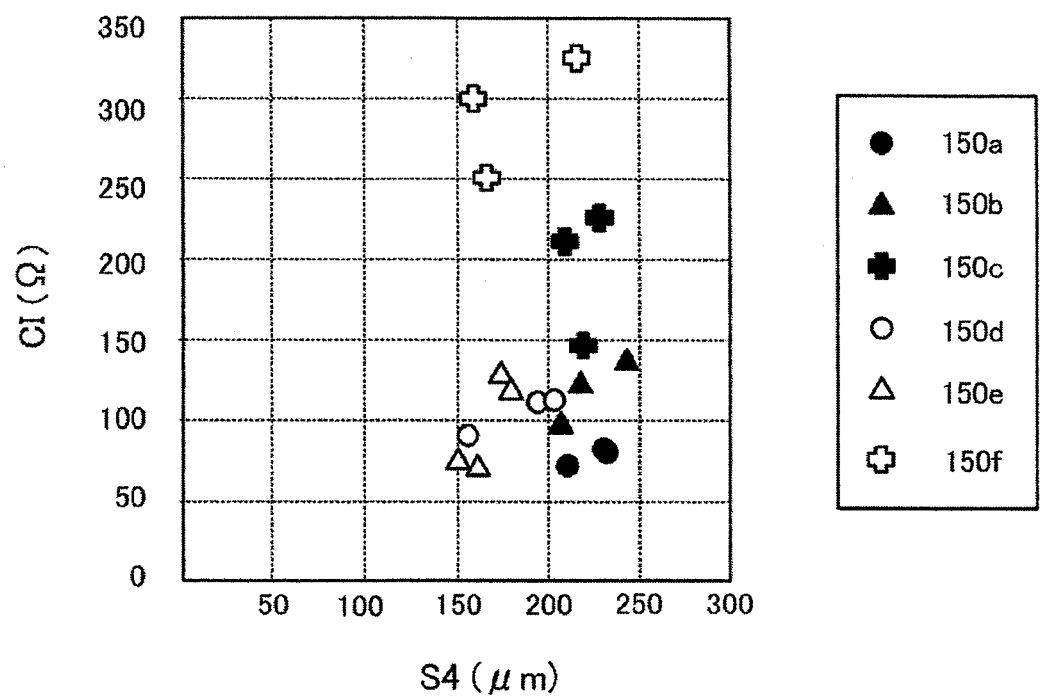
FIG. 4A is a graph which illustrates the relationship between a length S4 of the bonding region of the electrically-conductive adhesive agent 141 and the electrode pad 132 in the transverse direction (the Z'-axis direction) of the crystal device 100 and a CI value.

FIG. 4A is a graph which illustrates the relationship between the length S4 of the bonding region of the electrically-conductive adhesive agent 141 and the electrode pad 132 in the transverse direction (the Z'-axis direction) of the crystal device 100 and the CI value. In the graph of FIG. 4A, the bonding condition 150a is marked with a black circle, the bonding condition 150b is marked with a black triangle, the bonding condition 150c is marked with a black cross, the bonding condition 150d is marked with an outlined circle, the bonding condition 150e is marked with an outlined triangle, and the bonding condition 150f is marked with an outlined cross. In each of the bonding conditions, three or four of the crystal devices 100 are formed to obtain the CI values. The outlined marks represent the bonding conditions 150d~150f, wherein the length S4 is smaller, and the black marks represent the bonding conditions 150a~150c, wherein the length S4 is larger. According to FIG. 4A, the lengths S4 of the outlined marks are in a range of about 300 μm~400 μm, and the lengths S4 of the black marks are in a range of about 400 μm~500 μm. In FIG. 4A, the dispersion of the CI values respectively corresponding to the lengths S4 of the outlined marks and the lengths S4 of the black marks is wide, and no correlation is observed between the lengths S4 and the CI values. Therefore, no specific relevance between the lengths S4 and the CI values is established.

Figure 4B:
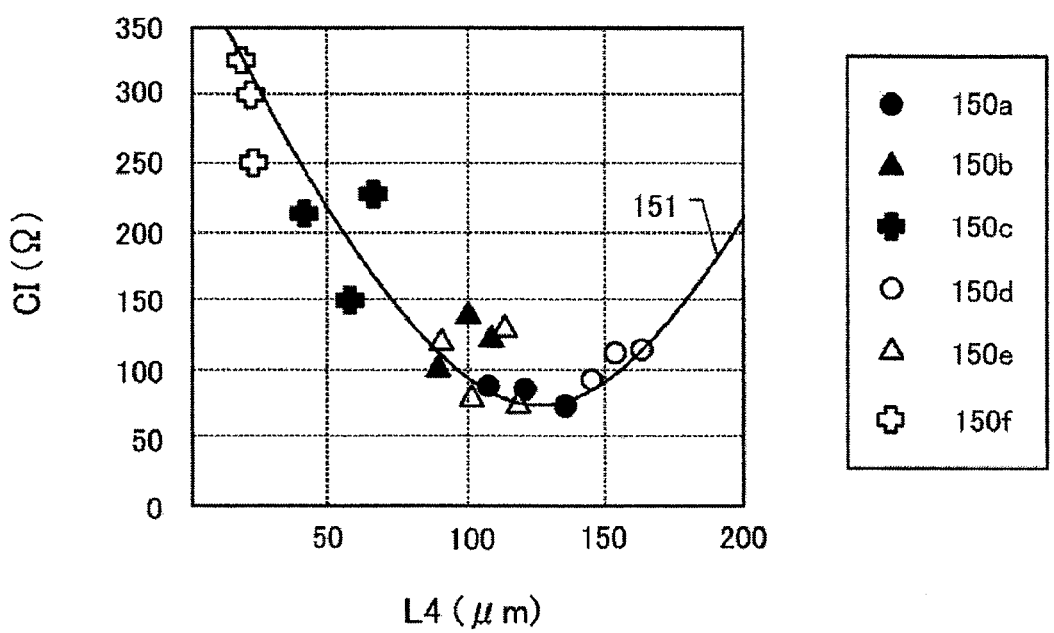
FIG. 4B is a graph which illustrates the relationship between the shortest distance L4 from an end portion of the electrically-conductive adhesive agent 141 to an end portion of the excitation electrode 131 in the longitudinal direction (the X-axis direction) of the crystal device 100 and the CI value.

FIG. 4B is a graph which illustrates the relationship between the shortest distance L4 from an end portion of the electrically-conductive adhesive agent 141 to an end portion of the excitation electrode 131 in the longitudinal direction (the X-axis direction) of the crystal device 100 and the CI value. In FIG. 4B, the bonding conditions 150a~150f are marked the same as in FIG. 4A. In FIG. 4B, the bonding conditions 150a~150f are dispersed on a quadratic curve 151. That is, there is a relevant relationship between the distances L4 and the CI values. It is being observed that if the distance between the excitation electrode 131 and the electrically-conductive adhesive agent 141 is short, the fixed electrically-conductive adhesive agent 141 interferes with the oscillation of the excitation section 134a, and as a result, the CI value increases. In addition, if the distance between the excitation electrode 131 and the electrically-conductive adhesive agent 141 is large, the excitation section 134a becomes unstable, and the CI value increases as well. According to FIG. 4B, the distance L4 is preferably between 100 μm~150 μm where the CI value is below 100Ω.

In the crystal plate 130, a predetermined oscillation is formed by the excitation electrode 131. That is, the size of the excitation electrode 131 affects the oscillation formed in the crystal plate 130. Provided that the distance L4 has an effect on the oscillation formed in the crystal plate 130, it has been observed that there is a relevant relationship between the size of the excitation electrode 131 and the distance L4. Since the distance L4 is preferably between 100 μm~150 μm when the length L2 of the long side of the excitation electrode 131 is 0.7 mm, the distance L4 is preferably about 14%~22% of the length L2. In addition, since the size of the excitation electrode 131 is in a specific proportion to the size of the crystal plate 130, the distance L4 can also be compared with the length L1 of the long side of the crystal plate 130. In that case, the distance L4 is preferably 10%~15% of the length L1 of the long side of the crystal plate 130. The aforesaid relationship between the distance L4 and the length L1 not only applicable to the mesa-type crystal plate but is also applicable to a crystal plate that is formed into a planar shape.

<Example of Formation of Bonding Status Inspection Region 136>

The bonding status inspection region 136 is preferably formed based on the results derived from the aforesaid bonding conditions of the crystal plate 130 and the electrically-conductive adhesive agent 141. Examples of the formation of the bonding status inspection region 136 are described below with reference to the crystal plates 130a-130d as shown in FIGS. 5A-5D. In the crystal plates of FIGS. 5A-5D, the bonding status inspection regions 136 are respectively formed in different positions or have different shapes.

Figure 5A:
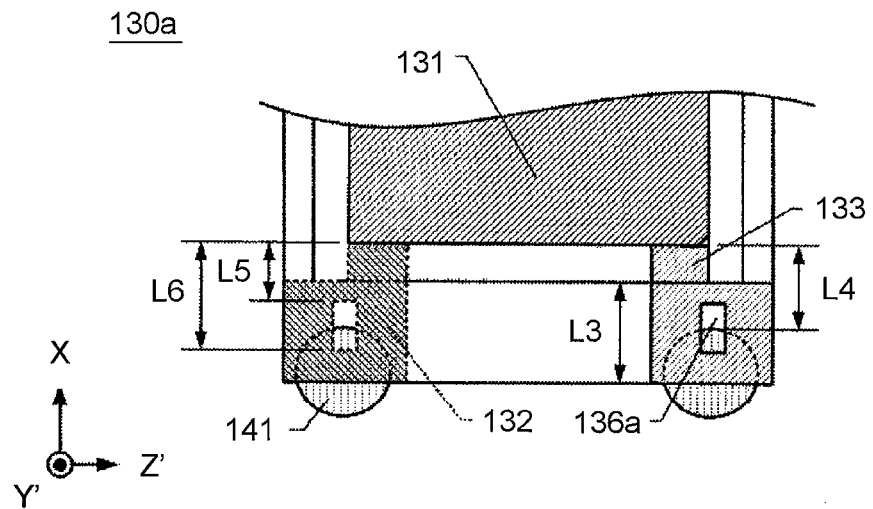

FIG. 5A is a plane view depicting the electrode pads 132 and the electrically-conductive adhesive agent 141 of the crystal plate 130a. The bonding status inspection regions 136a are respectively surrounded by the electrode pads 132 that are formed at the +Z'-axis side and the −Z'-axis side of the crystal plate 130a. The bonding status inspection region 136a is formed in a way that a distance L5 between an end portion of the bonding status inspection region 136a at the +X-axis side and an end portion of the excitation electrode 131 at the −X-axis side in the longitudinal direction (the X-axis direction) is 10% of the length L1, and a distance L6 between an end portion of the bonding status inspection region 136a at the −X-axis side and the end portion of the excitation electrode 131 at the −X-axis side in the longitudinal direction (the X-axis direction) is 15% of the length L1. Moreover, the bonding status inspection region 136a is included in a central section of the electrode pad 132 in the Z'-axis direction.

According to FIG. 4B, the shortest distance L4 between the end portion of the electrically-conductive adhesive agent 141 and the end portion of the excitation electrode 131 in the longitudinal direction (the X-axis direction) is preferably 10%~15% of the length L1. When the electrically-conductive adhesive agent 141 and the electrode pad 132 are bonded, it is desirable to observe the end portion of the electrically-conductive adhesive agent 141 at the +X-axis side, so as to determine the distance L4. Referring to the crystal plate 130a as depicted in FIG. 5A, since the bonding status inspection region 136a is configured in a distance range that is 10%~15% of the length L1 from the end portion of the excitation electrode 131 at the −X-axis side, when the electrically-conductive adhesive agent 141 is formed in a desirable position, the end portion of the electrically-conductive adhesive agent 141 at the +X-axis side can be observed via the bonding status inspection region 136a.

In addition, the electrical resistance between the electrically-conductive adhesive agent 141 and the electrode pad 132 is reduced as the bonding area of the electrically-conductive adhesive agent 141 and the electrode pad 132 increases. Therefore, a large bonding area is preferred. In the crystal plate 130a, a length of the bonding status inspection region 136a in the X-axis direction is formed to be less than 0.05 mm, and a width thereof in the Z'-axis direction is less than 0.15 mm. In other words, the area of the bonding status inspection region 136a is not more than a quarter of the area of the electrode pad 132 (or less than 25% of the area of the electrode pad 132). Based on the above, the bonding status of the electrically-conductive adhesive agent 141 can be checked through forming the bonding status inspection region 136a in the crystal plate 130a, and what is more, the bonding status inspection region 136a is formed only on the requisite region, so as to maintain the bonding area of the electrically-conductive adhesive agent 141 and the electrode pad 132 to reduce the electrical resistance.

Figure 5B:
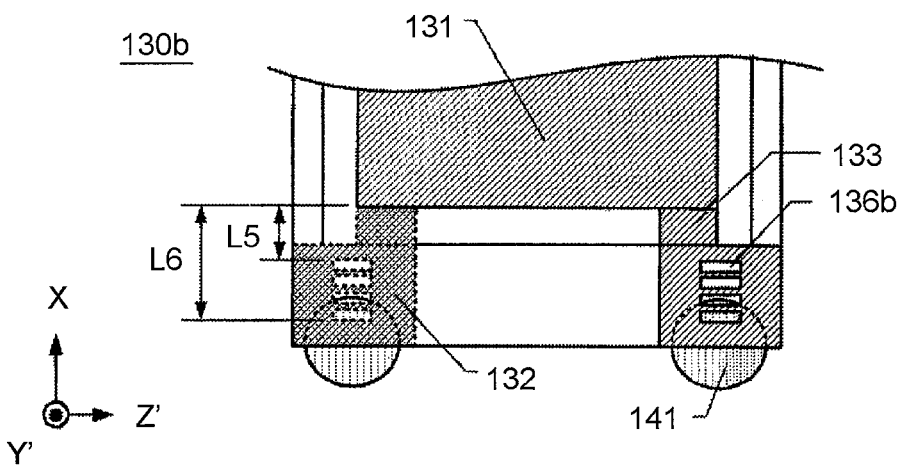
FIG. 5B is a plane view of the electrode pads 132 and the electrically-conductive adhesive agent 141 of the crystal plate 130b.

FIG. 5B is a plane view of the electrode pads 132 and the electrically-conductive adhesive agent 141 of the crystal plate 130b. A plurality of bonding status inspection regions 136b are formed in each of the electrode pads 132 of the crystal plate 130b. The bonding status inspection regions 136b are arranged in the X-axis direction. The end portion of the electrically-conductive adhesive agent 141 at the +X-axis side is formed in one of the bonding status inspection regions 136b, and the value of the distance L4 can be easily determined by confirming the bonding status inspection region 136b where the end portion of the electrically-conductive adhesive agent 141 at the +X-axis side is located. For example, four bonding status inspection regions 136b, which are arranged in the X-axis direction, are formed in each of the electrode pads 132 in FIG. 5B. In addition, the bonding status inspection region 136b that is formed closest to the +X-axis side has end portions at the +X-axis side and the −X-axis side, which are formed in a distance range, which is 10%~11% of the length L1 of the long side of the crystal plate 130b, from the end portion of the excitation electrode 131 at the −X-axis side. The bonding status inspection region 136b that is second closest to the +X-axis side has end portions at the +X-axis side and the −X-axis side, which are formed in a distance range, which is 11%~12% of the length L1 of the long side of the crystal plate 130b, from the end portion of the excitation electrode 131 at the −X-axis side. The bonding status inspection region 136b that is third closest to the +X-axis side has end portions at the +X-axis side and the −X-axis side, which are formed in a distance range, which is 12%~13% of the length L1 of the long side of the crystal plate 130b, from the end portion of the excitation electrode 131 at the −X-axis side. The bonding status inspection region 136b that is fourth closest to the +X-axis side has end portions at the +X-axis side and the −X-axis side, which are formed in a distance range, which is 13%~15% of the length L1 of the long side of the crystal plate 130b, from the end portion of the excitation electrode 131 at the −X-axis side. Referring to FIG. 5B, because the end portion of the electrically-conductive adhesive agent 141 at the +X-axis side is in the bonding status inspection region 136b that is third closest to the +X-axis side, it is known that the distance L4 is in a range of 12%~13% of the length L1 of the long side of the crystal plate 130b.

Figure 5C:
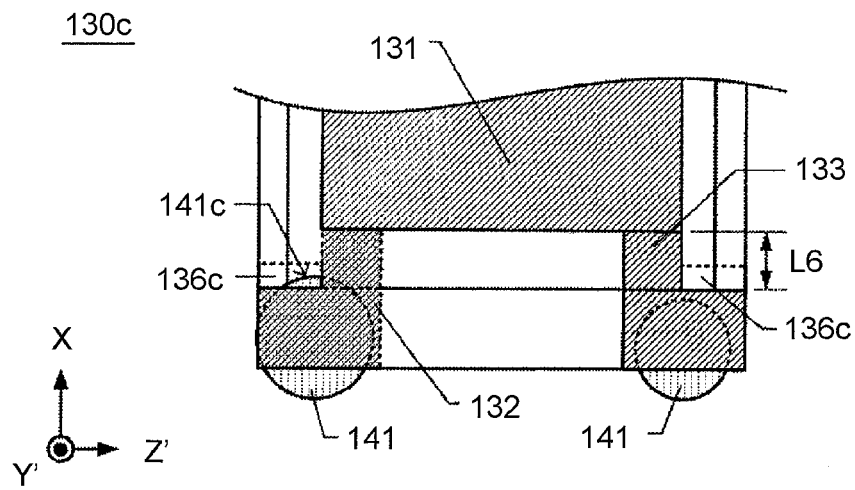
FIG. 5C is a plane view of the electrode pads 132 and the electrically-conductive adhesive agent 141 of the crystal plate 130c.

FIG. 5C is a plane view depicting the electrode pads 132 and the electrically-conductive adhesive agent 141 of the crystal plate 130c. In the crystal plate 130c, the bonding status inspection region 136c is formed adjacent to the +X-axis side of the electrode pad 132. Moreover, the distance L6 between the end portion of the electrode pad 132 at the +X-axis side and the end portion of the excitation electrode 131 at the −X-axis side is formed to be 10% of the length L1. Referring to FIG. 5C, the electrically-conductive adhesive agent 141 that is formed at the −Z'-axis side protrudes out of the end portion of the electrode pad 132 at the +X-axis side (marked with an arrow 141c). Herein, the distance L4 is below 10% of the length L1, which is unfavorable. On the other hand, the electrically-conductive adhesive agent 141 at the +Z'-axis side in FIG. 5C does not protrude out of the end portion of the electrode pad 132 at the +X-axis side. Therefore, it can be determined that the electrically-conductive adhesive agent 141 at the +Z'-axis side is formed in a position in which the distance L4 is not less than 10% of the length L1.

Figure 5D:
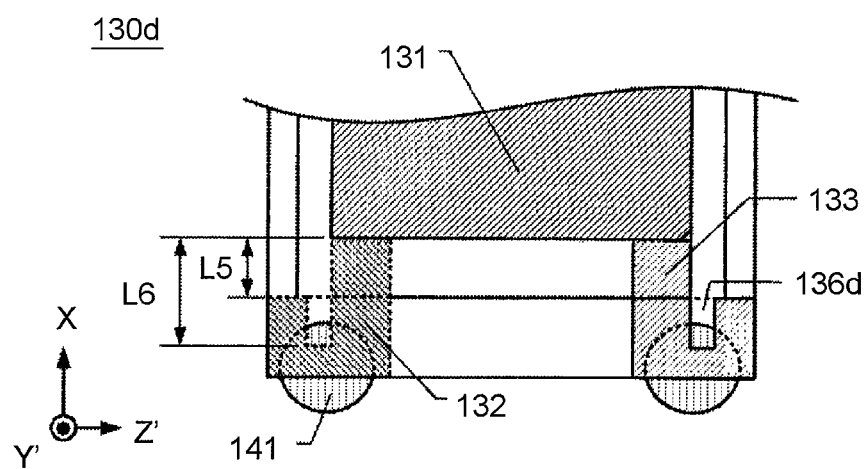
FIG. 5D is a plane view of the electrode pads 132 and the electrically-conductive adhesive agent 141 of the crystal plate 130d.

FIG. 5D is a plane view of the electrode pads 132 and the electrically-conductive adhesive agent 141 of the crystal plate 130d. In the crystal plate 130d, the distance L5 between the end portion of the bonding status inspection region 136d at the +X-axis side and the end portion of the excitation electrode 131 at the −X-axis side is formed to be 10% of the length L1, and the distance L6 between the end portion of the bonding status inspection region 136d at the −X-axis side and the end portion of the excitation electrode 131 at the −X-axis side is formed to be 15% of the length L1. In addition, a distance between the end portion of the electrode pad 132 at the +X-axis side and the end portion of the excitation electrode 131 at the −X-axis side is formed equal to the distance L5. In other words, the end portion of the bonding status inspection region 136d at the +X-axis side is not closed by the electrode pad 132. The same as the crystal plate 130a of FIG. 5A, the bonding status of the electrically-conductive adhesive agent 141 in the crystal plate 130d of FIG. 5D can be determined by observing the end portion of the electrically-conductive adhesive agent 141 at the +X-axis side.

<Inspection Method of Crystal Device 100>

Figure 6:
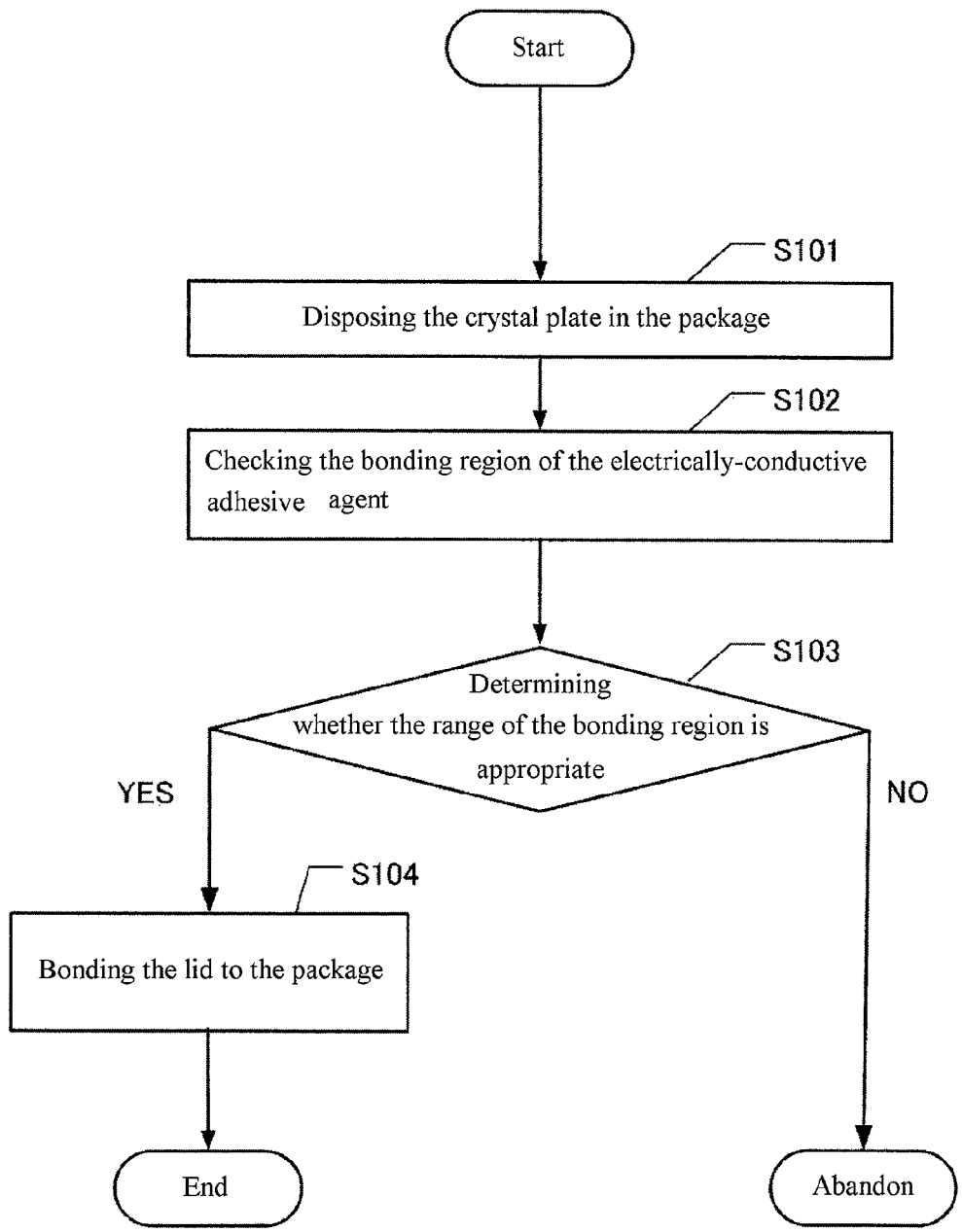
FIG. 6 is a flowchart illustrating an inspection method of the crystal device 100.

FIG. 6 is a flowchart illustrating an inspection method of the crystal device 100. The inspection method for inspecting the bonding status of the electrically-conductive adhesive agent 141 during the fabrication of the crystal device 100 is explained with reference to FIG. 6.

In Step S101, the crystal plate 130 is disposed in the package 120. The electrode pads 132 of the crystal plate 130 are electrically connected with the connection terminals 124 via the electrically-conductive adhesive agent 141.

In Step S102, the bonding region of the electrically-conductive adhesive agent 141 is checked. A method for checking the bonding region is explained with reference to FIG. 7A.

Figure 7A:
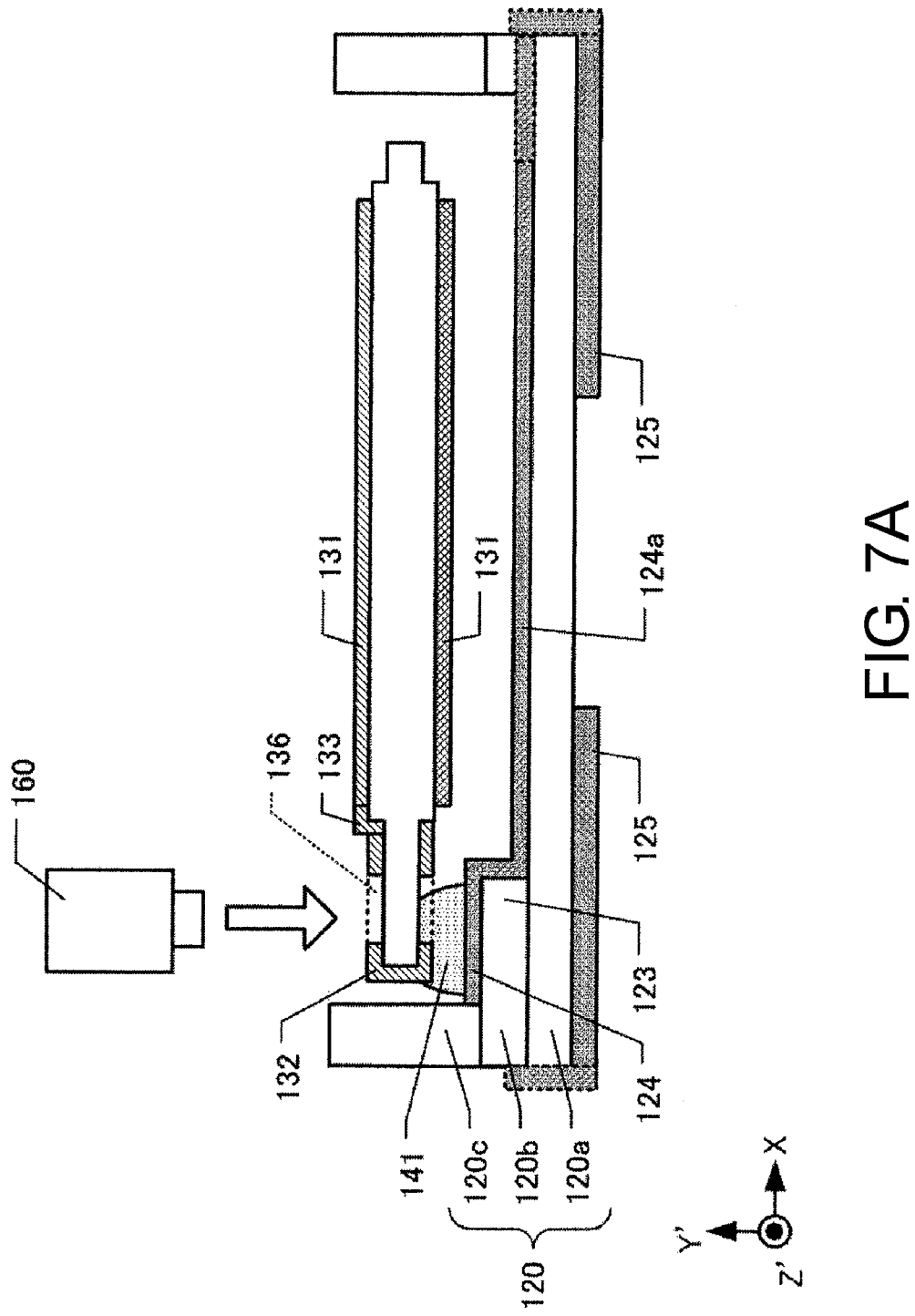
FIG. 7A is a cross-sectional view of the package 120 and the crystal plate 130.

FIG. 7A is a cross-sectional view of the package 120 and the crystal plate 130. In addition, the cross-sectional view of FIG. 7A includes a cross-section of the line B-B of the below-described FIG. 7B. The connection terminals 124 of the package 120 and the electrode pads 132 of the crystal plate 130 are bonded to each other respectively via the electrically-conductive adhesive agent 141. The checking of the bonding region of the electrically-conductive adhesive agent 141 is performed by using an eye or an imaging element 160 to observe the bonding status inspection region 136 from the +Y'-axis side.

Step S103 is to determine whether a range of the bonding region is appropriate. A method for determining whether the range of the bonding region is appropriate is explained with reference to FIG. 7B.

Figure 7B:
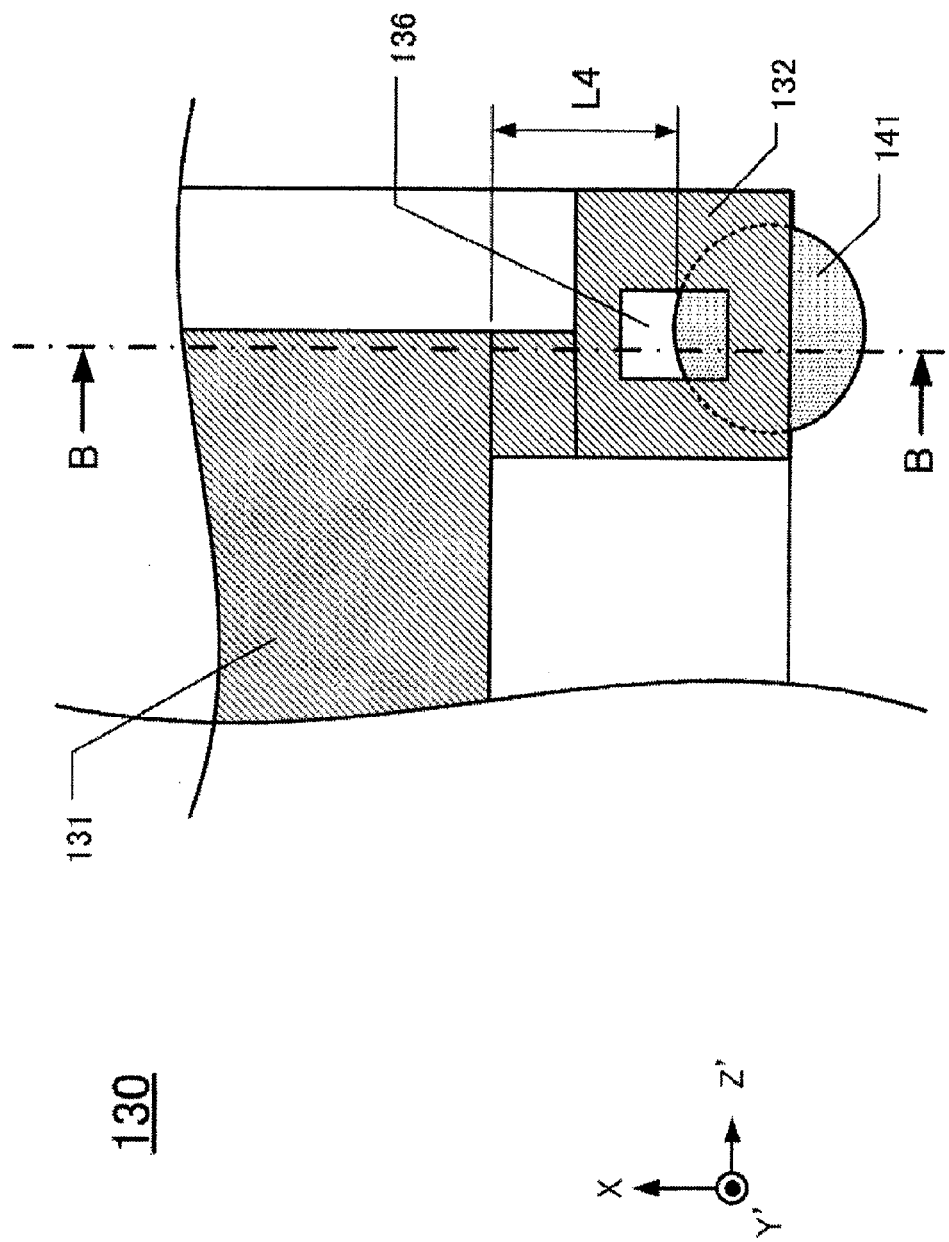
FIG. 7B is a plane view depicting the electrode pad 132 of the crystal plate 130 and an area around the electrode pad 132.

FIG. 7B is a plane view depicting the electrode pad 132 of the crystal plate 130 and an area around the electrode pad 132. The electrically-conductive adhesive agent 141 is bonded to the -Y'-axis side of the electrode pad 132 shown in FIG. 7B. FIG. 7B depicts a view that the end portion of the electrically-conductive adhesive agent 141 at the +X-axis side is observed in the bonding status inspection region 136. Whether the end portion of the electrically-conductive adhesive agent 141 at the +X-axis side can be observed in the bonding status inspection region 136, for example, is a reference for determining if the range of the bonding region is appropriate. In the case that the end portion of the electrically-conductive adhesive agent 141 at the +X-axis side is observed in the bonding status inspection region 136, it is determined that the distance L4 between the end portion of the excitation electrode 131 at the -X-axis side and the end portion of the electrically-conductive adhesive agent 141 at the +X-axis side is in the range of 10%~15% of the length L1, and accordingly, the range of the bonding region is appropriate. On the other hand, in the case that the electrically-conductive adhesive agent 141 is formed but the end portion thereof at the +X-axis side cannot be observed in the bonding status inspection region 136, the electrically-conductive adhesive agent 141 cannot be checked at all, or other parts of the electrically-conductive adhesive agent 141 are observed in the bonding status inspection region 136, the range of the bonding region is inappropriate.

Besides from observing the bonding status inspection region 136, a peripheral section of the electrode pad 132 can also serve as an inspection region. For example, the bonding status of the electrically-conductive adhesive agent 141 can also be determined by checking whether the electrically-conductive adhesive agent 141 protrudes out of the +X-axis side, the -X-axis side, the +Z'-axis side, and the -Z'-axis side of the electrode pad 132. In FIG. 7B, the electrically-conductive adhesive agent 141 is observed at the -X-axis side of the electrode pad 132, but not at the +X-axis side, the +Z'-axis side, and the -Z'-axis side of the electrode pad 132. The bonding condition can be varied according to the observation requirement.

Reverting to FIG. 6, in Step S103, whether the range of the bonding region is appropriate is determined, for example, according to the determining criterion as shown in FIG. 7B. If the result indicates that the range of the bonding region is inappropriate, the method proceeds to "NO" and the crystal device is abandoned. On the other hand, if the result indicates the range of the bonding region is appropriate, the method proceeds to "YES" and moves on to Step S104.

In Step S104, the lid 110 is bonded to the package 120, and the crystal device 100 is formed.

According to the inspection method of the crystal device, as illustrated in FIG. 6, nondestructive inspection can be performed during the fabrication of the crystal device to check the bonding status of the crystal plate. Therefore, when inappropriate bonding occurs, the crystal device can be remade.

Second Embodiment

The bonding status inspection region also applies to a crystal plate, in which electrode pads are respectively formed at the +X-axis side and the -X-axis side thereof. A crystal device 200, which includes the lid 110, a package 220, and a crystal plate 230 having electrode pads respectively formed on two ends of the crystal plate 230 at the +X-axis side and the -X-axis side, is described below. In the following descriptions, elements the same as those in the first embodiment are represented by the same reference numerals, and thus detailed descriptions thereof are omitted hereinafter.

<Structure of Crystal Device 200>

Figure 8A:
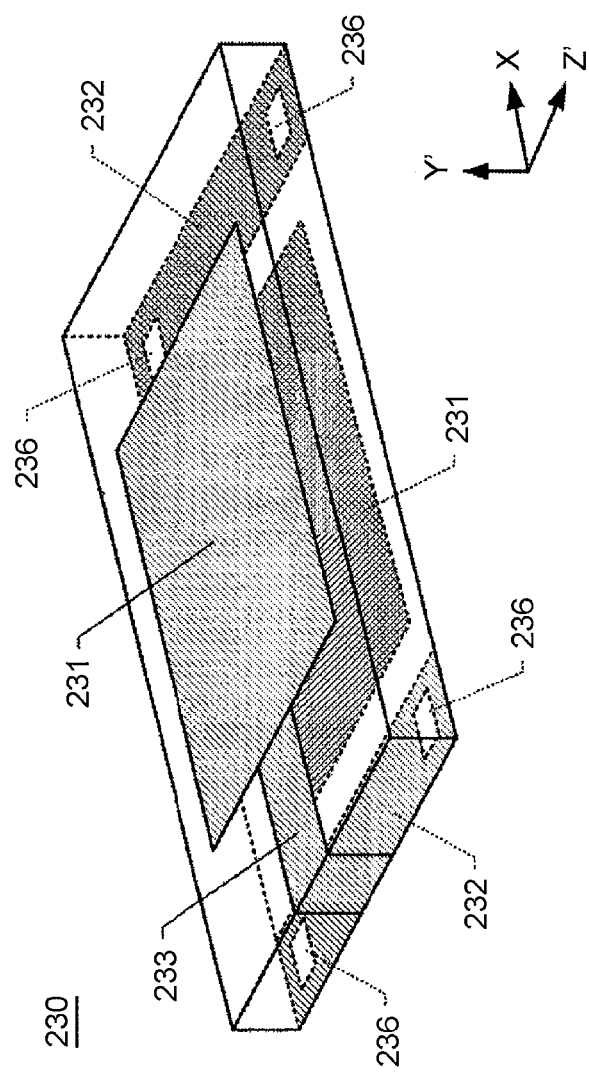
FIG. 8A is a perspective view of a crystal plate 230.

FIG. 8A is a perspective view of the crystal plate 230. Excitation electrodes 231 are respectively formed on the principal surfaces of the crystal plate 230 at the +Y'-axis side and the -Y'-axis side. On the -Y'-axis side of the crystal plate 230, electrode pads 232 are respectively formed at the +X-axis side and the -X-axis side of the crystal plate 230. The excitation electrode 231 on the +Y'-axis side of the crystal plate 230 is electrically connected with the electrode pad 232 at the -X-axis side of the crystal plate 230 via an extraction electrode 233, and the excitation electrode 231 on the -Y'-axis side of the crystal plate 230 is electrically connected with the electrode pad 232 at the +X-axis side of the crystal plate 230 via another extraction electrode 233. Bonding status inspection regions 236 are respectively formed near the end portions of the electrode pads 232 at the +Z-axis side and the -Z'-axis side, and the bonding status inspection regions 236 are surrounded by the electrode pads 232.

Figure 8B:
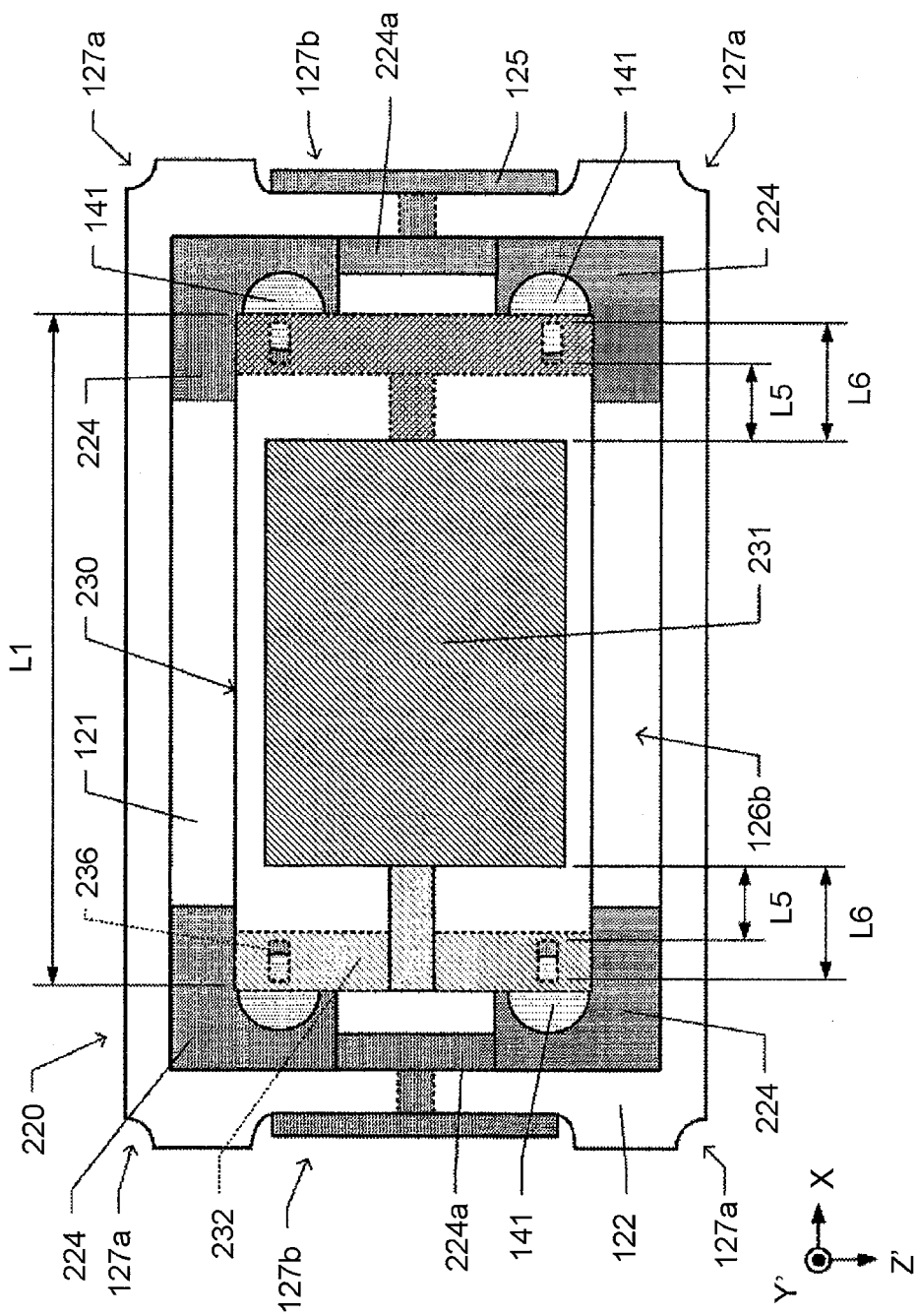
FIG. 8B is a plane view of a package 220, in which the crystal plate 230 is disposed.

FIG. 8B is a plane view of the package 220, in which the crystal plate 230 is disposed. In the package 220, carrier regions (not shown) are respectively formed in four corners of the bottom surface 126b of the concave 121, and connection terminals 224 are respectively formed on surfaces of the carrier regions at the +Y'-axis side. The connection terminals 224 and the mounting terminal 125 formed at the -X-axis side are electrically connected with each other via a connection electrode 224a, and the connection terminals 224 and the mounting terminal 125 formed at the +X-axis side are electrically connected with each other via another connection electrode 224a. Other parts of the configuration of the package 220 are the same as package 120. The crystal plate 230 is disposed on the +Y'-axis side of the connection terminals 224 via the electrically-conductive adhesive agent 141. The crystal plate 230 is bonded to the electrically-conductive adhesive agent 141 through the electrode pads 232 at four corners of the crystal plate 230. In addition, the bonding status inspection regions 236 are respectively formed in a part of the bonding region where the electrically-conductive adhesive agent 141 is bonded to the crystal plate 230. The bonding status of the electrically-conductive adhesive agent 141 and the crystal plate 230 can be checked via the bonding status inspection regions 236.

An inspection method of the crystal device 200 is performed with the same steps as the inspection method of the crystal device 100, as illustrated in FIG. 6. First, in Step S101, the crystal plate 230 is disposed in the package 220. Then, in Step S102, the bonding region of the electrically-conductive adhesive agent 141 is checked. Step S102 is performed by using eyes or the imaging element 160 to observe the bonding status inspection regions 236, which are formed at four positions as shown in FIG. 8B, from the +Y'-axis side. Step S103 is to determine whether the range of the bonding region is appropriate. As illustrated in FIG. 7B, Step S103 is carried out by observing the end portion of the electrically-conductive adhesive agent 141 at the +X-axis side or the −X-axis side, which may be seen in the bonding status inspection regions 236. If the end portion of the electrically-conductive adhesive agent 141 at the +X-axis side is not seen in the bonding status inspection region 236, the crystal device 200 is abandoned. Otherwise, Step S104 is performed to bond the lid 110 to the package 220.

The exemplary embodiments of the invention have been described in detail above. However, it is clear to persons skilled in the art that modifications or variations may be made to the embodiments without departing from the scope or spirit of the invention.

For example, the piezoelectric oscillating plate described in the above embodiments is an AT-cut crystal oscillating plate; however, a BT-cut crystal oscillating plate, which also oscillates by thickness-shear mode, is also applicable. Moreover, the material of the piezoelectric oscillating plate is not limited to a crystal material. Lithium tantalite (LiTaO$_3$), lithium niobate (LiNbO$_3$), or a piezoelectric material containing piezoelectric ceramics is basically suitable.

What is claimed is:

1. A crystal device, comprising:
   a crystal plate having a rectangular shape and comprising a pair of long sides and a pair of short sides;
   a pair of excitation electrodes respectively configured on a front side and a back side of the crystal plate;
   a pair of extraction electrodes extending from the pair of excitation electrodes;
   a pair of electrode pads configured along at least one of the pair of short sides of the crystal plate and electrically connected with the pair of extraction electrodes;
   a package having a mounting surface and a bottom surface opposite to the mounting surface and comprising a pair of mounting terminals configured on the mounting surface and a pair of connection terminals configured on the bottom surface and electrically connected with the pair of mounting terminals; and
   an electrically-conductive adhesive agent bonding and fixing the pair of connection terminals and the pair of electrode pads,
   wherein a bonding status inspection region, on which no metal film is formed, is configured in the crystal plate and surrounded by or connected to the pair of electrode pads, and the bonding status inspection region occupies not more than 25% of an area of the pair of electrode pads.

2. A crystal device, comprising:
   a crystal plate having a rectangular shape and comprising a pair of long sides and a pair of short sides;
   a pair of excitation electrodes respectively configured on a front side and a back side of the crystal plate;
   a pair of extraction electrodes extending from the pair of excitation electrodes;
   a pair of electrode pads configured along at least one of the pair of short sides of the crystal plate and electrically connected with the pair of extraction electrodes;
   a package having a mounting surface and a bottom surface opposite to the mounting surface and comprising a pair of mounting terminals configured on the mounting surface and a pair of connection terminals configured on the bottom surface, and electrically connected with the pair of mounting terminals; and
   an electrically-conductive adhesive agent bonding and fixing the pair of connection terminals and the pair of electrode pads,
   wherein a bonding status inspection region, on which no metal film is formed, is configured in the crystal plate and surrounded by or connected to the pair of electrode pads, and the bonding status inspection region is configured at least in a range, which is 10%~15% of a length of the crystal plate in a longitudinal direction, from an end portion of the pair of excitation electrode at a side of the electrode pads.

3. The crystal device according to claim 1, wherein the bonding status inspection region is formed at least in a range, which is 10%~15% of a length of the crystal plate in a longitudinal direction, from an end portion of the pair of excitation electrode at a side of the pair of electrode pads.

4. The crystal device according to claim 1, wherein a plurality of the bonding status inspection regions are configured and arranged in a longitudinal direction.

5. An inspection method for inspecting a crystal device comprising a crystal plate having a rectangular shape and comprising a pair of long sides and a pair of short sides, a pair of excitation electrodes respectively configured on a front side and a back side of the crystal plate, a pair of extraction electrodes extending from the pair of excitation electrodes, a pair of electrode pads electrically connected with the pair of extraction electrodes, and a package comprising a pair of connection terminals bonded to the electrode pads via an electrically-conductive adhesive agent, wherein a bonding status inspection region, on which no metal film is formed, is configured in the crystal plate and surrounded by or connected to the pair of electrode pads, and the bonding status inspection region occupies not more than 25% of an area of the pair of electrode pads, the inspection method comprising:
   checking a bonding region of the electrically-conductive adhesive agent via the bonding status inspection region; and
   determining whether a range of the bonding region is a appropriate range.

6. The inspection method of the crystal device according to claim 5, wherein the range of the bonding region of the electrically-conductive adhesive agent is determined appropriate when a distance between an end portion of the electrically-conductive adhesive agent at a side of the pair of excitation electrode and an end portion of the pair of excitation electrode at a side of the pair of electrode pads is 10%~15% of a length of the crystal plate in a longitudinal direction.

7. The inspection method of the crystal device according to claim 6, wherein the bonding status inspection region is configured at least in the appropriate range of the bonding region, and the determining process is performed to determine whether the end portion of the electrically-conductive adhesive agent at the side of the pair of excitation electrode is in the appropriate range.

8. The inspection method of the crystal device according to claim 5, wherein the checking process is performed by using an imaging element to image a region including the bonding status inspection region.

* * * * *